United States Patent
Jo et al.

(10) Patent No.: US 9,389,262 B2
(45) Date of Patent: Jul. 12, 2016

(54) FAULT DETECTION DEVICE, ELECTRICAL INSTRUMENT AND FAULT DETECTION METHOD

(75) Inventors: Se Jin Jo, Gunpo-si (KR); Myung Chul Kim, Yongin-si (KR); Yoon Sup Kim, Suwon-si (KR); Ki Hong Noh, Seoul (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 1063 days.

(21) Appl. No.: 13/356,751

(22) Filed: Jan. 24, 2012

(65) Prior Publication Data

US 2012/0223719 A1 Sep. 6, 2012

(30) Foreign Application Priority Data

Mar. 3, 2011 (KR) ........................ 10-2011-0018958

(51) Int. Cl.
  *G01R 31/14* (2006.01)
  *G01R 31/08* (2006.01)
  *G01R 31/10* (2006.01)
  *G01R 31/02* (2006.01)
  *G01R 19/165* (2006.01)
  *G01R 31/30* (2006.01)
  *G01R 31/28* (2006.01)

(52) U.S. Cl.
  CPC .......... *G01R 31/02* (2013.01); *G01R 19/16547* (2013.01); *G01R 31/025* (2013.01); *G01R 31/2825* (2013.01); *G01R 31/3012* (2013.01)

(58) Field of Classification Search
  CPC .... G01R 31/02; G01R 31/2825; G01R 31/40; G01R 31/025; G01R 31/3012; G01R 19/16547
  USPC ................................ 324/500, 522, 511, 750.3
  See application file for complete search history.

(56) References Cited

U.S. PATENT DOCUMENTS

2009/0009180 A1* 1/2009 Varghai et al. ................ 324/521
2009/0261855 A1* 10/2009 Wirt .............................. 324/771

FOREIGN PATENT DOCUMENTS

KR 10-2005-0070914 7/2005

OTHER PUBLICATIONS

Korean Office Action issued Feb. 26, 2015 in corresponding Korean Patent Application No. 10-2011-0018958.

* cited by examiner

*Primary Examiner* — Amy He
(74) *Attorney, Agent, or Firm* — Staas & Halsey LLP (57) ABSTRACT

A fault detection device includes an interface electrically connected to an electrical instrument to transfer commercial power to the electrical instrument, transmit a command for driving one of a plurality of loads included in the electrical instrument to the electrical instrument, and detect current flowing in one of the plurality of loads of the electrical instrument; and a terminal configured to receive a current signal corresponding to the current flowing in one of the plurality of loads from the interface, determine whether the one load has a fault on the basis of the received current signal and display whether the load has a fault. A faulty load is determined by detecting current of only a load suspected to have a fault when a fault is generated in the electrical instrument so as to improve fault detection accuracy.

6 Claims, 7 Drawing Sheets

| LOAD NAME | SELECT (v) | POWER (kw) | FAULT STATE |
|---|---|---|---|
| COMPRESSOR | ☑ | X | POOR |
| FAN | ☑ | Y | GOOD |
| FIRST DAMPER | ☐ | | |
| SECOND DAMPER | ☐ | | |
| HEATER | ☐ | | |
| BOARD (PBA) | ☐ | | |

MODEL NUMBER: SSR

FIG. 5

FIG. 7

FAULT DETECTION DEVICE, ELECTRICAL INSTRUMENT AND FAULT DETECTION METHOD

CROSS-REFERENCE TO RELATED APPLICATIONS

This application claims the benefit of Korean Patent Application No. 10-2011-0018958, filed on Mar. 3, 2011 in the Korean Intellectual Property Office, the disclosure of which is incorporated herein by reference.

BACKGROUND

1. Field

Embodiments of the present disclosure relate to a fault detection device, an electrical instrument and a fault detection method.

2. Description of the Related Art

An electrical instrument can confirm a fault generated therein while performing an operation and output a warning sound or display a fault code corresponding to fault information when a fault is generated such that a user recognizes the fault. At this time, the user recognizes only the fault state and has difficulty judging the cause of the fault only with the warning sound or fault code and to cope with the fault.

Accordingly, the user contacts a service center to seek advice on how to handle the fault or requests after-sales service.

At the user's request, a service engineer visits the corresponding home, checks the electrical instrument, finds the load having a fault and repairs the load having a fault if it is repairable using loads (for example, PBA, motor, etc.) he carries.

However, it is difficult to find out an exact fault in many cases. Particularly, the service engineer has difficulty correctly diagnosing a faulty load and handling the faulty load if the service engineer is inexperienced. In this case, the service engineer may have to visit the corresponding home many times to solve the problem. This requires long service time and high labor costs.

When a problem of an electrical instrument is diagnosed, the electrical instrument is disassembled and a tester is connected to each internal load of the electrical instrument to check a faulty load and subsequently repair it. This takes a relatively long time and requires a complicated process.

Particularly, if the service engineer does not carry a load required for repair, it will be necessary to visit the corresponding home again, which is inconvenient and takes a long time.

SUMMARY

Therefore, it is an aspect of the present disclosure to provide a fault detection device connected to an electrical instrument to respectively control operations of a plurality of loads included in the electrical instrument and detect a fault on the basis of power generated when each load is driven and a fault detection method.

It is another aspect of the present disclosure to provide an electrical instrument that respectively controls operations of a plurality of loads and detects a fault on the basis of power generated when each load is driven.

It is another aspect of the present disclosure to provide a fault detection device and an electrical instrument to transmit power generated when each load is driven to a terminal.

Additional aspects of the disclosure will be set forth in part in the description which follows and, in part, will be apparent from the description, or may be learned by practice of the disclosure.

In accordance with one aspect of the present disclosure, a fault detection device includes an interface electrically connected to an electrical instrument to transfer commercial power to the electrical instrument, transmit a command to drive one of a plurality of loads included in the electrical instrument to the electrical instrument, and detect current flowing in one of the plurality of loads of the electrical instrument, and a terminal configured to receive a current signal corresponding to the current flowing in one of the plurality of loads from the interface, determine whether a fault is generated in the load on the basis of the received current signal, and display whether a fault is generated in the load.

The terminal may include an input unit through which information on the electrical instrument is input and at least one of the plurality of loads included in the electrical instruments is selected, a display unit to display a list of the plurality of loads included in the electrical instruments and display whether a fault is generated, a controller to control information on the selected load to be transmitted to the interface, and a communication unit to perform communication with the interface.

The terminal may further include a storage unit to store information on a plurality of electrical instruments, store a list of a plurality of loads included in each electrical instrument, and respectively store normal power ranges of the plurality of loads included in each electrical instrument, wherein the controller calculates power of the load on the basis of a current signal corresponding to current flowing in the load, received from the interface, and determines whether a fault is generated in the load by checking if the calculated power is within the normal power range of the load.

The interface may include a controller to control a load driving command to be transmitted to the electrical instrument when receiving a load selecting signal from the terminal, a current detector to detect current flowing in the load when the load is driven, and a communication unit to receive the load selecting signal from the terminal, transmit the load driving command to the electrical instrument, and transmit a current signal corresponding to the current flowing in the load to the terminal.

The controller may control commands for driving a plurality of loads to be sequentially transmitted when receiving signals for selecting the plurality of loads.

The interface may further include a connecting terminal connected to a first power terminal of the electrical instrument, and a second power terminal that is connected to a commercial power supply and transfers commercial power to the connecting terminal through the current detector.

The current detector may be arranged between the connecting terminal and the second power terminal.

The interface may further include an A/D converter to convert a signal corresponding to the detected current into a digital signal and transmit the digital signal to the controller.

The terminal may have an application that communicates with the interface to detect a fault in the electrical instrument.

The interface and the terminal may be independently provided and communicate with each other to transmit and receive various signals.

In accordance with another aspect of the present disclosure, a fault detection device includes an input unit through which at least one of a plurality of loads included in an electrical instrument is selected, a current detector to detect current flowing in the at least one load when the at least one load is driven, a controller to determine whether a fault is generated in the at least one load on the basis of the detected current, and a display unit to display whether a fault is generated in the at least one load.

The controller may instruct one load to be driven when the one load is selected, determine whether a fault is generated in the load on the basis of current detected when the load is driven, instruct two or more loads to be sequentially driven when the two or more loads are selected, and determine whether a fault is generated in each of the two or more loads on the basis of current detected when each of the two or more loads is driven.

The fault detection device may further include a connecting terminal connected to a first power terminal of the electrical instrument, and a second power terminal that is connected to a commercial power supply and transfers commercial power to the connecting terminal through the current detector.

The fault detection device may further include a storage unit to store a normal power range for each load, wherein the controller calculates power of the load on the basis of current detected when the load is driven, determines whether the calculated power is within a normal power range of the load, and determines that the load has a fault when the calculated power is not within the normal power range.

The fault detection device may further include a communication unit to transmit a command for driving the at least one load to the electrical instrument in response to an instruction from the controller.

The fault detection device may further include an A/D converter to convert a signal corresponding to the detected current into a digital signal and transmit the digital signal to the controller.

In accordance with another aspect of the present disclosure, an electrical instrument includes a plurality of loads, a fault detector comprising a current detector to respectively detect currents flowing in the plurality of loads and a controller to determine whether each of the loads has a fault on the basis of detected current of each load, and a display to display whether each load has a fault.

The controller may sequentially control the plurality of loads to be driven and receive a current signal from the current detector when each of the loads is driven.

The electrical instrument may further include an input unit through which a load is selected, wherein the controller controls the selected load to be driven and sequentially controls a plurality of loads to be driven when the plurality of loads are selected.

The electrical instrument may further include a communication unit to transmit information about a fault of the load to a server in response to an instruction from the controller.

The fault detector may further include an A/D converter to convert a signal corresponding to current detected by the current detector into a digital signal and to transmit the digital signal to the controller.

The display unit may display a message representing a fault of the load.

The electrical instrument may further include a communication unit to transmit a signal corresponding to current of each load to a terminal capable of determining a fault in response to an instruction of the controller.

The electrical instrument may further include a storage unit to store a normal power range for each load, wherein the controller calculates power of each load on the basis of current detected when each load is driven, determines whether the calculated power is within a normal power range of each load, and determines that the load has a fault when the calculated power is out of the normal power range.

In accordance with another aspect of the present disclosure, a fault detection method includes selecting one or two or more loads from a plurality of loads included in an electrical instrument; transmitting a command to drive a selected load to the electrical instrument, sequentially transmitting commands for driving a plurality of loads to the electrical instrument if the plurality of loads are selected; detecting current of each of the selected loads; determining whether each of the selected load has a fault on the basis of the current of each load; and outputting information representing whether each load has a fault.

The determining of whether each load has a fault may include calculating power of each load on the basis of the current of each load; determining whether the power of each load is within a predetermined normal power range of each load; determining that a load having power out of its normal power range has a fault; and determining a load having power within its normal power range to be normal.

The determining of whether each load has a fault may include transmitting the current of each load to a terminal, and determining whether each load has a fault and displaying whether each load has a fault in the terminal.

The selecting of one or two or more loads from the plurality of loads may include receiving a load selecting signal from the terminal.

The fault detection method may further include transmitting fault information on each load to a server.

The calculating of the power may include detecting a voltage of at least one load and calculating the power based on the current and the voltage.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION

Reference will now be made in detail to the embodiments of the present disclosure, examples of which are illustrated in the accompanying drawings, wherein like reference numerals refer to like elements throughout.

Figure 1:
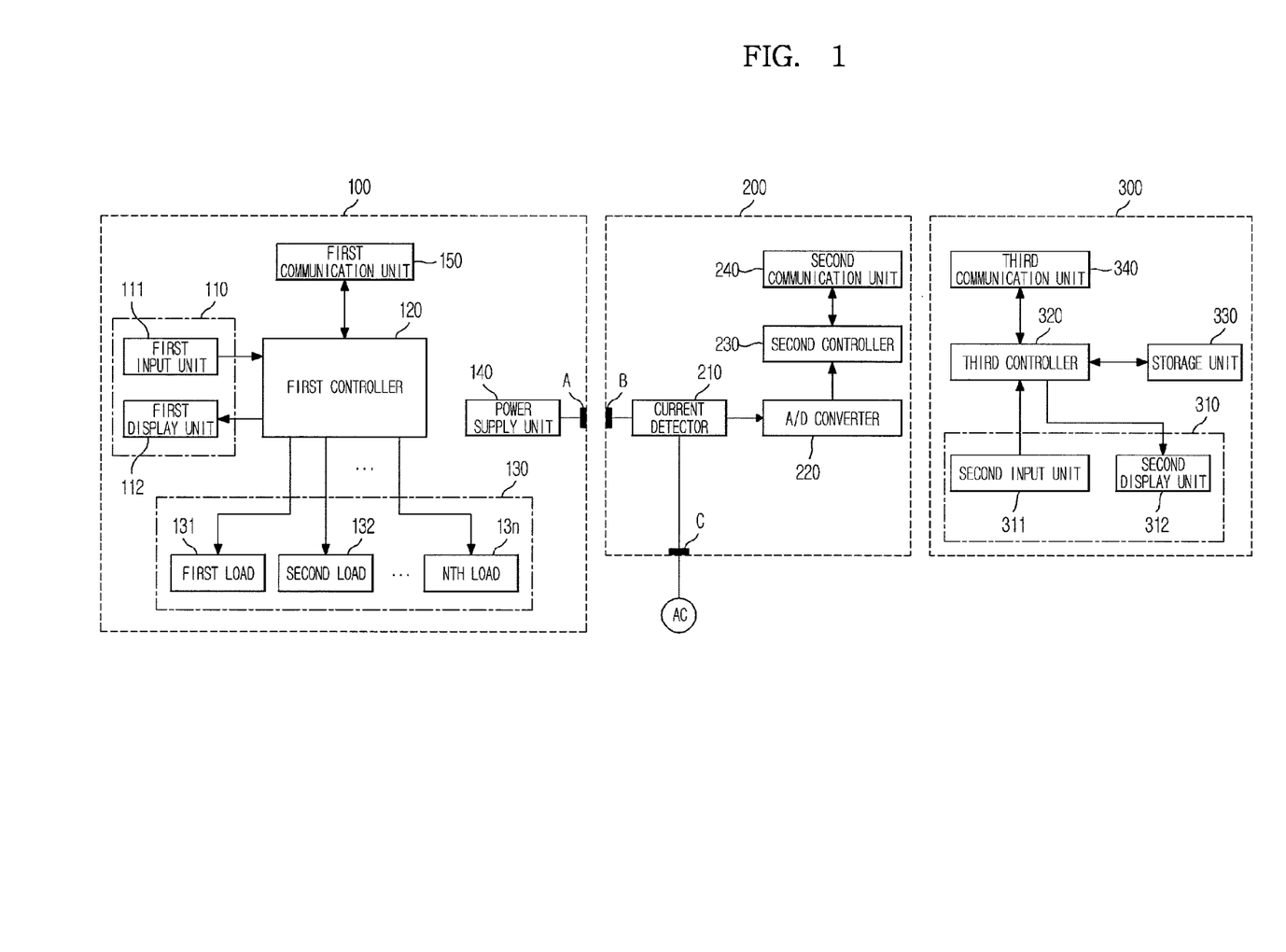
FIG. 1 is a block diagram of a fault detection system according to an embodiment of the present disclosure.

FIG. 1 is a block diagram of a fault device system according to an embodiment of the present disclosure. The fault detection system includes an electrical instrument 100 and fault detection devices. Here, the fault detection devices include an interface 200 and a terminal 300.

A service engineer carries the interface 200 and the terminal 300 and visits a home in which the electrical instrument 100 is installed when requested to repair the electrical instrument 100. The service engineer detects a fault in the electrical instrument 100 using the interface 200 and the terminal 300.

The electrical instrument 100 is a device powered by electricity, developed to improve convenience and quality of life, and performs functions corresponding to purposes.

The electrical instrument 100 includes industrial and household instruments.

Industrial electrical instruments include generating and power transmission plants, industrial motors, application apparatuses, etc. and household electrical instruments include a washing machine, a drying machine, an air conditioner, a refrigerator, a TV receiver, an electric fan, a cleaner, a computer, an audio system, etc.

The electrical instrument 100 includes a first input/output unit 110, a first controller 120, a load part 130, a power supply unit 140, and a first communication unit 150.

The first input/output unit 110 includes a first input unit 111 and a first display unit 112. The first input/output unit 110 may be implemented as a touchscreen.

A user inputs at least one of a target value for power on/off, temporary interruption or driving of the electrical instrument 100, and an operation mode to the first input unit 111. The first input unit 111 transmits the information input by the user to the first controller 120.

The first display unit 112 displays a driving state of the electrical instrument 100 and a target value set by the user and displays a fault state if a fault is generated in the electrical instrument 100.

In addition, the first display unit 112 may display at least one of a home-page address and phone number of a service center when a fault is generated in the electrical instrument 100.

The first controller 120 controls power supply to loads 131 to 13n in response to power on/off and temporary interruption and controls operations of the loads 131 to 13n on the basis of at least one of the target value and operation mode.

Upon transmission of a command to drive one of the loads through the first communication unit 150, the first controller 120 determines a fault detection mode and controls the operation of the corresponding load for a predetermined time.

In addition, upon simultaneous reception of signals for selecting a plurality of loads from the interface 200, the first controller 120 may sequentially control operations of the plurality of loads corresponding to the received signals.

Here, the first controller 120 may control the operations of the plurality of loads in an order predetermined by the interface 200 for a predetermined time or respectively control the operations of the plurality of loads in an arbitrary order and transmit information about the operating loads to the interface 200.

The load part 130 is a device that consumes power to perform a predetermined operation to obtain a desired effect and includes the plurality of loads 131 to 13n.

Further, the load part 130 may be configured of a single load, and a Printed Board Assembly (PBA) in which the first controller 120 and the first communication 150 are mounted may be set as a load.

The plurality of loads 131 to 13n are connected to the power supply 140 so as to be provided with power from the power supply unit 140 and they are driven according to a command of the first controller 120.

Predetermined rated current flows in the loads 131 to 13n when the loads 131 to 13n are in a normal state whereas low current considerably lower than the rate current or over-current considerably higher than the rated current flows in the loads 131 to 13n when they have faults. For example, the over-current may be generated due to short-circuit and the low current may be generated due to disconnection.

The power supply unit 140 is supplied with power from a commercial power supply (AC) and provides drive power to the components 110, 120 and 150 and the loads 131 to 13n of the load part 130.

The power supply unit 140 includes a first power terminal A such as a plug. The first power terminal A is directly connected to the commercial power supply in case of a normal operation and connected to the commercial power supply via the interface 200 when a fault is generated in the electrical instrument. The connection of the first power terminal A is achieved by the user or service engineer.

The first communication unit 150 performs at least one of wired and wireless communication with the interface 200 and transmits a command of driving a load, received from the interface 200, to the first controller 120.

In addition, the first communication unit 150 may transmit information about a load currently being driven in a fault detection mode to the interface 200 in response to a command of the first controller 120.

The interface 200 is connected to the commercial power supply AC and the power supply unit 140 of the electrical instrument 100 in case of fault detection and supplied with power from the commercial power supply (AC) so as to provide the power to the electrical instrument 100. Here, the interface 200 detects current flowing in the electrical instrument 100 and transmits information about the detected current to the terminal 300.

The interface 200 includes a current detector 210, an ND converter 220, a second controller 230, and a second communication unit 240.

The interface 200 further includes a connecting terminal B connected to the first power terminal A of the electrical instrument 100 and a second power terminal C that is connected to the commercial power supply AC and supplies commercial power AC to the connecting terminal B. Here, the connecting terminal B is a socket and the second power terminal C is a plug connected to the commercial power supply AC.

The current detector 210 is provided between the connecting terminal B and the second power terminal C and outputs the commercial power supplied through the second power terminal C to the connecting terminal B so as to supply drive power to the electrical instrument 100. That is, the current detector 210 connects the electrical instrument 100 and the commercial power supply AC.

The current detector 210 detects current flowing through the loads of the electrical instrument 100 while supplying the driving power to the electrical instrument 100 and transmits the detected current to the A/D converter 220.

The interface 200 may further include a voltage detector (not shown) that detects the voltage of the commercial power provided to the electrical instrument 100.

Since exactly 220V is not supplied to homes through the commercial power and there is a minute difference among voltages supplied to the respective homes, the voltage of the commercial power is detected in order to calculate exact power for fault detection and the detected voltage is transmitted to the terminal 300.

The A/D converter 220 converts the detected current into a digital signal and transmits the digital signal to the second controller 230. This operation may be performed by the second controller 230.

The second controller 230 controls operations of the current detector 210 and the second communication unit 240.

The second controller 230 controls transmission of a command of driving a single load when a signal for selecting a single load is transmitted from the terminal 300 and sequentially controls transmission of commands of driving a plurality of loads when signals for selecting a plurality of loads are transmitted from the terminal 300.

That is, the second controller 230 sequentially transmits load driving commands such that a plurality of loads is not simultaneously driven.

The second controller 230 transmits a command of driving one load to the electrical instrument 100 and controls transmission of current data corresponding to a current signal transmitted from the A/D converter 220.

When commands for driving a plurality of loads are simultaneously transmitted, the second controller 230 may confirm information about loads being driven, transmitted from the electrical instrument 100, match the confirmed loads and detected current, store the matched loads and current, and transmit information about the matched loads and current to the terminal 300.

The second communication unit 240 receives information about at least one selected load from the terminal 300, transmits the received information to the second controller 230, and transmits a command for driving the at least one load to the electrical instrument 100.

When a plurality of loads is selected, the second communication unit 240 sequentially transmits commands for driving the respective loads in response to a command of the second controller 230.

The second communication unit 240 transmits detected current data to the terminal 300.

The second communication unit 240 may be a communication unit that performs wired and wireless communications with the electrical instrument 100 and a communication unit that performs wireless communication such as Bluetooth with the terminal 300.

The terminal 300 is connected to the interface 200 through communication, receives current data from the interface 200, determines whether a fault is generated in the electrical instrument 100 on the basis of the received current data, and displays the determination result.

The terminal 300 includes a second input/output unit 310, a third controller 320, a storage unit 330, and a third communication unit 340.

The second input/output unit 310 is a user interface including a second input unit 311 and a second display unit 312 and may be implemented as a touchscreen.

The second input unit 311 receives information about one of a plurality of electrical instruments from a user. The user selects at least one of a plurality of loads included in one of the plurality of electrical instruments through the second input unit 311. In addition, the second input unit 311 transmits the information about one of the plurality of electrical instruments and information about at least one load to the third controller 320. Here, the information about an electrical instrument includes at least one of the name and model number of the electrical instrument.

The second display unit 312 displays a list of a plurality of loads included in one electrical instrument and displays whether a load selected from the plurality of loads through the second input unit 311 has a fault.

The second display unit 312 may display current, voltage and power values of a load being driven by means of graphs.

Furthermore, the second display unit 312 displays the model number of an electrical instrument when the name of the electrical instrument is input through the second input unit 312 such that the model number of the electrical instrument can be easily input.

The third controller 320 calculates power on the basis of current data received through the third communication unit 340 and checks whether the calculated power is within a normal power range so as to determine whether a load has a fault.

Here, the third controller 320 may receive voltage data from the interface 200 and calculate the power using the received voltage data and current data.

In addition, the third controller 320 may calculate the power using the voltage, 220V, and current of predetermined commercial power.

The storage unit 330 stores the names and model numbers of the plurality of electrical instruments, a list of loads of each electrical instrument model, and normal power ranges for loads included in each electrical instrument.

Here, a normal power range of each load is determined on the basis of rated power of each load.

The third communication unit 340 transmits a load name that is information about a selected load to the interface 200 in response to an instruction of the third controller 320.

The third communication unit 340 receives data about each load from the interface 200 and transmits the data to the third controller 320.

The terminal 300 has an application that communicates with the interface 200 so as to detect a fault in the electrical instrument 100. This application may be downloaded from an application store or a server, upgraded and updated.

In addition, the terminal 300 may directly control the loads of the electrical instrument 100 by directly transmitting load driving signals to the electrical instrument 100.

The fault detection device consisting of the interface and terminal detects current of only a load suspected to have a fault to determine a faulty load when a fault is generated in the electrical instrument, thereby improving fault detection accuracy and speed.

Accordingly, the service engineer is able to easily acquire information about a faulty load so as to reduce time and cost for follow-up service and the electrical instrument manufacturer can improve their corporate image.

The fault detection device shown in FIG. 1 will now be described in more detail with reference to FIG. 2

Figure 2:
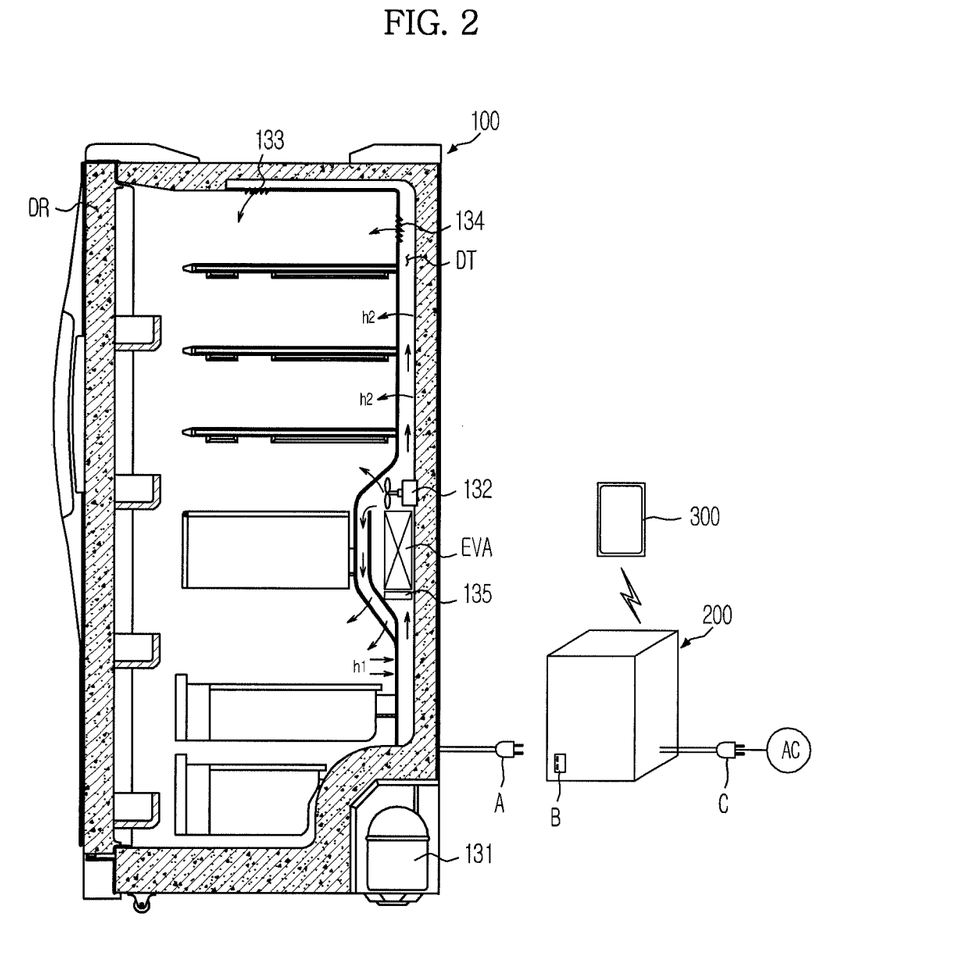
FIG. 2 illustrates an exemplary connecting structure of the fault detection system according to an embodiment of the present disclosure.

FIG. 2 illustrates an exemplary connecting structure of the fault detection system according to an embodiment of the present disclosure.

A refrigerator for keeping food fresh for a long period of time is described as an example of the electrical instrument 100.

As shown in FIG. 2, the refrigerator 100 includes a main body, a storage compartment for storing food, a door DR for opening and closing the storage compartment, and a machine room.

The storage compartment is divided by a partition into left and right regions corresponding to a refrigerating compartment and a freezing compartment. The front sides of the refrigerating compartment and freezing compartment are opened and the door DR for shielding the refrigerating compartment and freezing compartment is provided to the open front parts of the refrigerating compartment and freezing compartment.

The machine room includes a compressor 131 that drives a motor in a cooling operation mode to compress a low-pressure refrigerant into a high-pressure refrigerant and sends the high-pressure refrigerant to a condenser (not shown), and the condenser (not shown) that condenses the high-temperature high-pressure refrigerant compressed by the compressor 131 through heat radiation.

A duct DT through which cooling air flows is formed between the storage compartment and the main body, and a plurality of holes h1 and h2 is formed in walls forming the storage compartment. That is, cooling air of the storage compartment is moved to the duct DT through a plurality of suction holes h1 and cooling air of the duct DT is moved to the storage compartment through a plurality of discharge holes h2.

The duct DT includes an evaporator EVA, a fan 132, first and second dampers 133 and 134, and a heater 135 installed therein. The evaporator EVA cools the surrounding air according to a cooling action that absorbs latent heat while evaporating the refrigerant. The fan 132 rotates a motor to suck the cooling air of the storage compartment and blows the cooling air that has passed through the evaporator EVA to the storage compartment. The first and second dampers 133 and 134 are installed on the walls of the storage compartment and automatically open/close the discharge holes according to operations of motors thereof. The heater 135 generates heat in a defrost operation mode so as to remove frost generated in the evaporator EVA.

The refrigerator has the compressor 131, fan 132, first and second dampers 133 and 134, and heater 135 as loads, which are supplied with power from the power supply unit 140 and driven in response to a command of the first controller 120. In addition, the refrigerator may have a PBA including the first controller 120 that transmits control signals of the loads and receives driving signals as a load.

Furthermore, the refrigerator may further have a water supply valve as a load if it includes a dispenser and have an ice separator as a load if it includes an ice maker.

The refrigerator may have the first input/output unit 110 as a load, which is provided to the door DR, supplied with power from the power supply unit 140 and transmits/receives data to/from the first controller 120.

The refrigerator includes a first power terminal A such as a plug. The first power terminal A is directly connected to a commercial power supply when the refrigerator is normally operated. The first power terminal A is connected to the connecting terminal B of the interface 200 so as to be supplied with commercial power through the interface 200 when a fault is generated in the refrigerator.

Here, the interface 200 includes the connecting terminal B that is a socket and the second power terminal C that is a plug. The connecting terminal B of the interface 200 may be connected to the first power terminal A of the refrigerator and the second power terminal C of the interface 200 may be connected to the commercial power supply AC.

As described above, the refrigerator is electrically connected to the commercial power supply AC through the current detector 210 of the interface 200, and thus the interface 200 is able to detect current of the loads of the refrigerator.

The refrigerator drives one of the compressor 131, fan 132, first and second dampers 133 and 134, heater 135, PBA, water supply valve, ice separator, and first input/output unit when a load driving command is transmitted from the interface 200 in case of fault detection.

The first input/output unit 110 and the first controller 120 of the refrigerator will now be described.

The user inputs a target temperature of the storage compartment and an operation mode through the first input unit 111 of the first input/output unit 110. The first display unit 112 display a current driving state of the refrigerator, the target temperature of the storage compartment set by the user, a detected temperature of the storage compartment, a current operation mode such as rapid freezing operation, defrost operation and ice-making operation modes, and a fault state when a fault is generated.

The first controller 120 controls power supply to the loads 131 to 135 in response to power on/off and temporary interruption in a normal operation mode and controls operations of the loads 131 to 135 on the basis of the target temperature and detected temperature of the storage compartment such that the temperature of the storage compartment is kept as the target temperature.

That is, the first controller 120 controls a refrigeration cycle by driving the compressor 131 to compress a refrigerant into a high-temperature high-pressure refrigerant such that the internal temperature of the storage compartment is kept lower than the target temperature, and controls rotation of the fan 132 and opening/closing of the first and second dampers 133 and 134 selectively to thereby suck the air of the storage compartment and discharge air heat-exchanged in the evaporator EVA to the storage compartment.

Upon transmission of a command for driving one of the loads through the first communication unit 150, the first controller 120 determines a failure detection mode, controls the load corresponding to the command transmitted through the first communication unit 150 to be driven for a predetermined time and controls the other loads to be interrupted.

Here, the interface 200 detects current flowing in the refrigerator through the current detector 210 and transmits detected current data to the terminal 300 through wired or wireless communication.

Here, the current flowing in the refrigerator corresponds to one of the loads because only one of the loads of the refrigerator is driven in case of failure detection.

Figure 3:
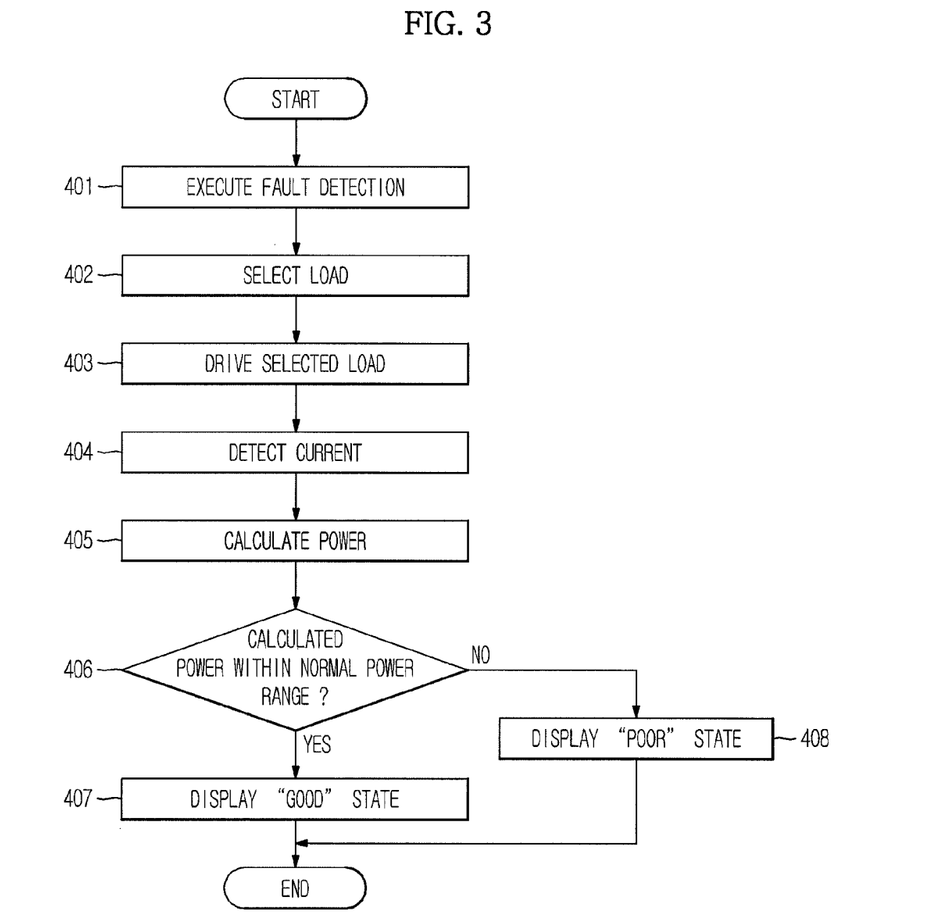
FIG. 3 is a flowchart illustrating a fault detection method according to an embodiment of the present disclosure.
Figure 4:
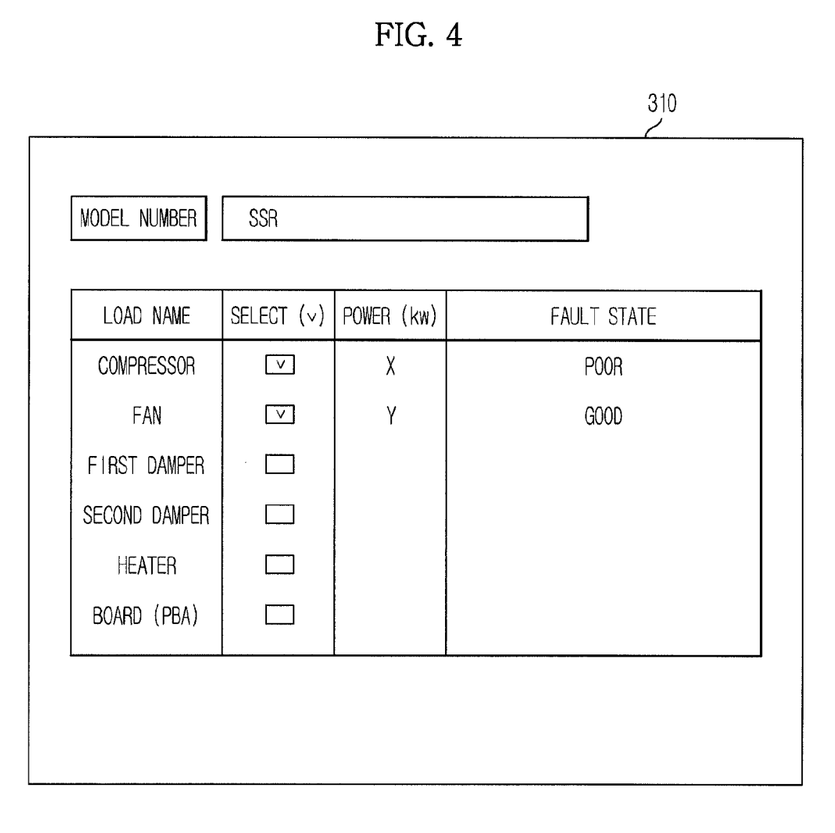
FIG. 4 shows exemplary information input/output to/from a terminal of the fault detection system according to an embodiment of the present disclosure.

FIG. 3 is a flowchart illustrating a fault detection method according to an embodiment of the present disclosure. The fault detection method will now be explained with reference to FIGS. 2, 3 and 4. FIG. 4 shows exemplary information input/output to/from the terminal of the fault detection system according to an embodiment of the present disclosure.

The refrigerator drives the compressor 131 based on a target temperature and detected temperature of the storage compartment such that the internal temperature of the storage compartment is kept below the target temperature, rotates the fan 132 and selectively opens the first and second dampers 133 and 134 such that cold air in the duct is circulated in the storage compartment.

Furthermore, the refrigerator periodically drives the heater 135 to remove frost generated in the evaporator EVA.

When the refrigerator determines that the internal temperature of the storage compartment is not below the target temperature since a refrigeration cycle is not normally performed or cooling efficiency of the storage compartment is deteriorated since a defrost operation is not normally carried out, the refrigerator displays a fault state through the first display unit 112 of the first input/output unit 110.

The user confirms the fault state displayed through the first display 112 of the refrigerator and contacts the service center for repair service. If the user suspects a fault in the refrigerator, the user may contact the service center and request the service center to provide repair service.

A service engineer of the service center visits the home in which the refrigerator having a fault is installed at the request of the user.

The service engineer carrying the interface 200 and the terminal 300 visits the home. The service engineer prepares for fault detection by connecting the first power terminal A of the refrigerator to the connecting terminal B of the interface 200 and connecting the second power terminal C of the interface 200 to the commercial power supply AC. Here, the refrigerator is provided with commercial power AC through the interface 200.

Then, the service engineer executes a fault detection application installed in the terminal 300. Accordingly, the terminal 300 executes the application for fault detection of the electrical instrument 100 (401) and displays an image showing execution of the application through the second input/output unit 310.

The image showing execution of the application, displayed on the second input/output unit 310, is illustrated in FIG. 4.

The application installed in the terminal 300 generates a plurality of input parts and a plurality of display parts and displays the input parts and display parts.

Specifically, the terminal 300 generates a model number display part for guiding input of a model number, a load name display part for guiding selection of a load name, a load power display part, a fault display part for indicating whether a fault a generated, a model number input part, and a load selection input part for selecting a load. Here, the model number input part may be generated in such a manner that a plurality of refrigerator model numbers is displayed such that one of the plurality of model numbers is selected.

As shown in FIG. 4, the second input/output unit 310 of the terminal 300 displays a compressor, fan, first damper, second damper, heater and board (PBA) as load names, displays the load selection input part by which loads are selected, displays the power display part for displaying power of selected loads, and displays the fault display part for indicating whether a fault is generated in the selected loads.

Here, the second input/output unit 310 displays whether a fault is generated in the selected loads in such a manner that it displays "good" for a load in a normal state and displays "poor" for a faulty load.

When the service engineer selects the compressor and fan from the plurality of loads of the refrigerator (402), the terminal 300 transmits signals for selecting the compressor and fan to the interface 200. The interface 200 transmits signals for driving the compressor and fan to the refrigerator.

Here, the interface 200 sequentially transmits the signals for driving the compressor and fan at a predetermined interval.

In addition, the terminal 300 may directly transmit the signal for selecting the compressor and fan to the refrigerator.

Upon reception of a command for driving the compressor from the interface 200, the refrigerator determines a fault detection mode, drives the compressor for a predetermined time and interrupts the other loads.

Here, the interface 200 detects current flowing in the refrigerator, converts the detected current into a digital signal and transmits the digital signal to the terminal 300. The current flowing in the refrigerator is compressor current that flows when the compressor is driven.

After a lapse of predetermined time from when the compressor is driven, the interface 200 transmits the signal for driving the fan to the refrigerator.

Upon reception of a command of driving the fan from the interface 200, the refrigerator determines a fault detection mode, drives the fan for a predetermined time and interrupts the other loads.

Here, the interface 200 detects current flowing in the refrigerator, converts the detected current into a digital signal and transmits the digital signal to the terminal 300. The current flowing in the refrigerator is fan current that flows when the fan is driven.

That is, the interface 200 detects current flowing in the refrigerator whenever a selected load is driven (403), converts the detected current into a digital signal and transmits the digital signal to the terminal 300.

For detection of compressor current and fan current, the interface 200 may detect the voltage of commercial power supplied to the refrigerator and transmit the voltage to the terminal 300.

It may also be possible to display current, voltage and power of the compressor as graphs when the current and voltage of the compressor are detected and display current, voltage and power of the fan as graphs when current and voltage of the fan are detected.

Upon transmission of the compressor current and fan current to the terminal 300 through the interface 200, the terminal 300 calculates power consumed when the compressor is driven using the compressor current, calculates power consumed when the fan is driven using the fan current, and display the calculated compressor power and fan power. That is, the terminal 300 calculates power of each of selected loads (405) and displays the calculated power.

Here, it may also be possible to calculate the power consumed when the compressor is driven and the power consumed when the fan is driven on the basis of commercial power of 200V or a detected voltage.

Subsequently, the terminal 300 determines whether the calculated compressor power is within a predetermined normal power range of the compressor, determines that the compressor normally operates if the calculated compressor power is within the predetermined normal power range, and determines that the compressor has a fault if the calculated compressor power is not within predetermined normal power range.

In addition, the terminal 300 determines whether the calculated fan power is within a predetermined normal power range of the fan, determines that the fan normally operates if the calculated fan power is within the predetermined normal power range, and determines that the fan has a fault if the calculated compressor power is not within the predetermined normal power range.

In this manner, the terminal 300 determines whether calculated power of a load is within a predetermined normal power range of the load (406), displays "good" when the calculated load is within the normal power range (407), and displays "poor" when the calculated load does is not within the normal power range (408).

As described above, the fault detection system selectively controls the loads in such a manner that it controls selected loads one by one, calculates power of each load, determines whether each load has a fault, and displays the power and fault state of each load, and thus the service engineer can easily recognize a fault generated in the electrical instrument.

Figure 5:
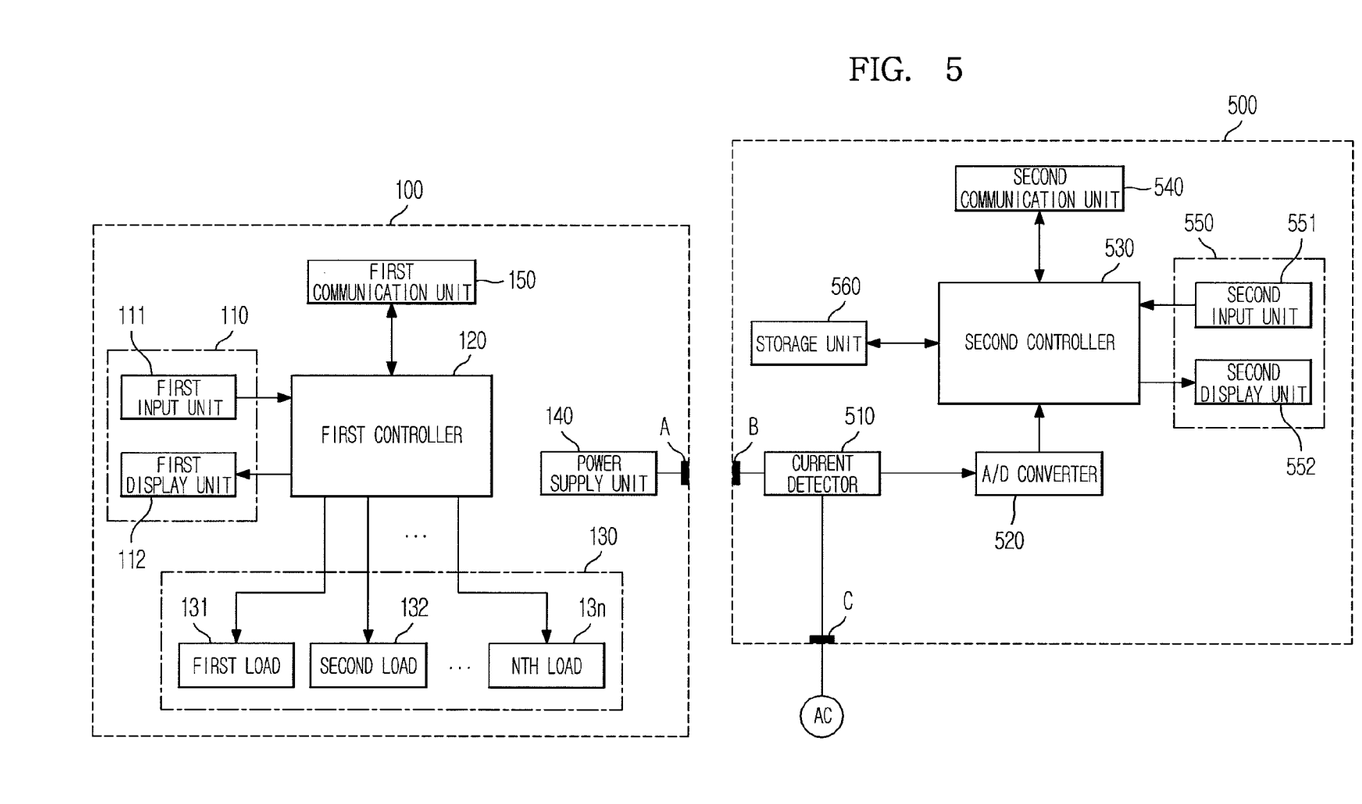
FIG. 5 is a block diagram of a fault device system according to another embodiment of the present disclosure.

FIG. 5 is a block diagram of a fault detection system according to another embodiment of the present disclosure. The fault detection system includes the electrical instrument 100 and a fault detection device 500.

At the request of a user who has the electrical instrument 100 having a fault, the service engineer visits the home in which the electrical instrument 100 is installed carrying the fault detection device 500 and detects a fault generated in the electrical instrument 100 using the fault detection device 500.

The electrical instrument 100 has the same configuration as the above-described electrical instrument and, as such, explanation thereof is omitted.

The fault detection device 500 is connected to the commercial power source AC and the power supply unit 140 of the electrical instrument 100 when fault detection is performed on the electrical instrument 100.

The fault detection device 500 is supplied with power from the commercial power supply AC and provides the power to the electrical instrument 100. Here, the fault detection device 500 detects current flowing in the electrical instrument 100, determines whether a fault is generated in the electrical instrument 100 on the basis of the detected current and displays the determination result.

The fault detection device 500 includes a current detector 510, an A/D converter 520, a second controller 530, a second communication unit 540, a second input/output unit 550, and a storage unit 560.

The fault detection device 500 further includes a connecting terminal B connected to the first power supply terminal A of the electrical instrument 100 and a second power supply terminal C that is connected to the commercial power supply AC and supplies commercial power AC to the connecting terminal B. Here, the connecting terminal B is a socket and the second power terminal C is a plug connected to the commercial power supply.

The current detector 510 is connected between the connecting terminal B and the second power terminal C and supplies driving power to the electrical instrument 100 by outputting the commercial power supplied through the second power terminal C to the connecting terminal B.

The current detector 510 detects current flowing in loads of the electrical instrument 100 while supplying the drive power to the electrical instrument 100 and transmits the detected current to the A/D converter 520.

The fault detection device 500 may further include a voltage detector (not shown) that detects the voltage of the commercial power supplied to the electrical instrument 100.

That is, since exactly 220V is not supplied to every home through the commercial power and there is a minute difference among the voltages provided to respective homes, the fault detection device 500 detects the voltage of commercial power supplied to each home to calculate accurate power for fault detection and transmits the detected voltage to the terminal 300.

The A/D converter 520 converts the detected current into a digital signal and transmits the digital signal to the second controller 530. The second controller 530 may convert the detected current into a digital signal.

The second controller 530 controls operations of the current detector 510 and the second communication unit 540.

The second controller 530 controls transmission of a command for driving one of the loads of the electrical instrument 100 when a signal for selecting one of the loads is transmitted from a second input unit 551 and sequentially controls transmission of commands for driving a plurality of loads when signals for selecting the plurality of loads are transmitted from the second input unit 551.

That is, the second controller 530 sequentially transmits the commands for driving the plurality of loads such that the loads are not simultaneously driven.

The second controller 530 transmits a command for driving one of the loads to the electrical instrument 100, calculates power based on a current signal transmitted from the A/D converter 520, and checks whether the calculated power is within a predetermined normal power range to determine whether a fault is generated in the electrical instrument 100.

Here, the second controller 530 may detect the voltage of the electrical instrument 100 and calculate the power using the detected voltage and current.

Furthermore, the second controller 530 may calculate the power using voltage, 220V, and current of the predetermined commercial power.

In addition, if the second controller 530 simultaneously transmits commands for driving a plurality of loads, the second controller 530 may confirm information on loads being driven, transmitted from the electrical instrument 100, match the loads with detected current, store the matched result and calculate power using the matched loads and current.

The second communication unit 540 transmits a load driving command to the electrical instrument 100.

If a plurality of loads is selected, the second communication unit 540 sequentially transmits commands for driving the loads in response to a command of the second controller 530.

The second input/output unit 540 is a user interface having the second input unit 551 and a second display unit 552. The second input/output unit 550 may be implemented as a touchscreen.

The user inputs information on one of a plurality of electrical instruments to the second input unit 551 and selects at least one of a plurality of loads of one electrical instrument through the second input unit 551. The second input unit 551 transmits the information on one of the electrical instruments and information on the at least one load to the second controller 520. Here, the information on the electrical instrument may include at least one of the name and model number of the electrical instrument.

The second display unit 552 displays a list of the plurality of loads of one of the electrical instruments and displays whether a fault is generated in the at least one load selected from the plurality of loads through the second input unit 551.

The second display unit 552 may display current, voltage and power values of loads being driven as graphs.

Furthermore, when the name of an electrical instrument is input through the second input unit 552, the second display unit 552 display the model number of the electrical instrument such that the model number of the electrical instrument can be easily input.

The storage unit 560 stores the names and model numbers of the plurality of electrical instruments, a list of loads corresponding to each electrical instrument model and a normal power range of each load of each electrical instrument. Here, the normal power range of each load is determined on the basis of a rated power of each load.

The storage unit 560 further stores an application for fault detection of the electrical instrument 100.

The application may be downloaded from an application store, or a server, upgraded and updated.

As described above, the fault detection device can determine a faulty load of the electrical instrument by detecting current of only a load suspected to have a fault when a fault is generated in the electrical instrument, to thereby improve fault detection accuracy and raise fault detection speed.

Accordingly, a service engineer can easily acquire information on a faulty load so as to reduce time and cost required for repair service and an electrical instrument manufacturer can enhance its corporate image.

Figure 6:
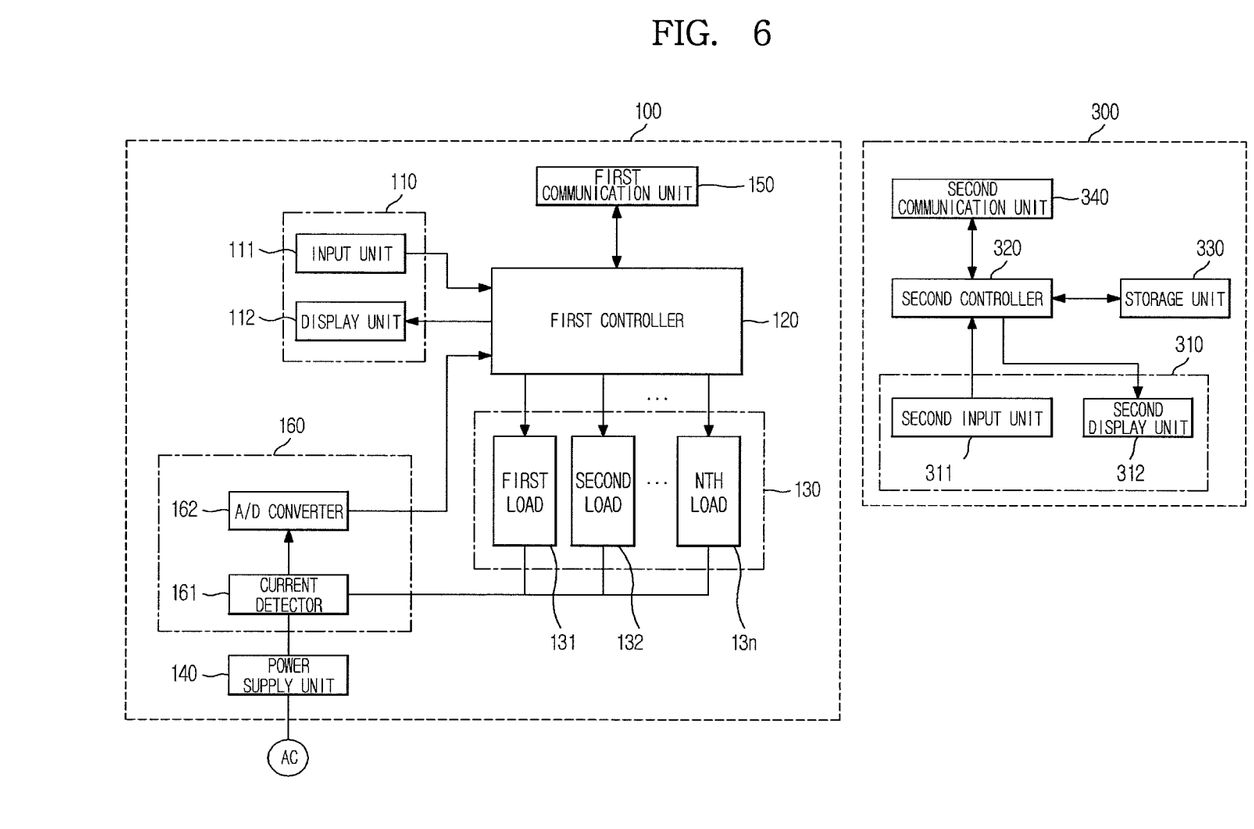
FIG. 6 is a block diagram of a fault device system according to another embodiment of the present disclosure.

FIG. 6 is a block diagram of a fault detection system according to another embodiment of the present disclosure. The fault detection system includes the electrical instrument 100 and the terminal 300.

The service engineer carrying the terminal 300 visits the home in which the electrical instrument 100 having a fault is installed and detects the fault of the electrical instrument 100 using the terminal 300.

The electrical instrument 100 includes the first input/output unit 110, the first controller 120, the load part 130, the power supply unit 140, the first communication unit 150, and a fault detector 160.

The first input/output unit 110 and load part 130 are identical to those of the electrical instrument 100 according to the above embodiment and, as such, explanations thereof are omitted.

Upon transmission of a command for driving one of loads include in the electrical instrument 100 from the terminal 300, the first controller 120 determines a fault detection mode and controls the corresponding load for a predetermined time.

If the first controller 120 simultaneously receives signals for selecting a plurality of loads from the terminal 300, the first controller 120 may sequentially control the plurality of loads to be driven.

Here, the first controller 120 may control the plurality of loads to be driven in the order predetermined by the terminal 300 or control the plurality of loads to be driven in an arbitrary order and transmit information on the loads being driven to the terminal 300.

The power supply unit 140 is provided with power from commercial power supply AC and supplies drive power to the components 110, 120 and 150 and loads 131 to 13n of the load part 130.

The first communication unit 150 performs at least one of wired and wireless communications with the terminal 300, transmits a load driving command received from the terminal 300 to the first controller 120, and transmits a current signal to the terminal 300.

In addition, the first communication unit 150 may transmit information on a load currently being driven in the fault detection mode to the terminal 300 in response to a command of the first controller 120.

The fault detector 160 detects current of each load and transmits the detected current to the first controller 120. The fault detector 160 includes a current detector 161 and an ND converter 162.

The current detector 161 connects the loads to the commercial power supply AC.

The current detector 161 detects current flowing in each load while supplying drive power to each load and transmits the detected current to the ND converter 162.

The electrical instrument 100 may further include a voltage detector (not shown) that detects the voltage of the commercial power.

The A/D converter 162 converts the detected current into a digital signal and transmits the digital signal to the first controller 120. The first controller 120 may convert the detected current into a digital signal.

The terminal 300 is connected to the electrical instrument 100 through communication so as to receive current data from the electrical instrument 100, determines whether a fault is generated in the electrical instrument 100 on the basis of the received current data and displays the determination result.

The terminal 300 includes the second input/output unit 310, the second controller 320, the storage unit 330 and the second communication unit 340.

The second input/output unit 310 is a user interface having the second input unit 311 and the second display unit 312 and may be implemented as a touchscreen.

The second input/output unit 310 may perform input and output operations through an application.

The user inputs information on one of a plurality of electrical instruments to the first input unit 311 and selects at least one of a plurality of loads of one of the plurality of electrical instruments through the first input unit 311. The first input unit 311 transmits the information on one of the electrical instruments and information on the at least one load to the third controller 320. Here, the information on the electrical instrument includes at least one of the name and model number of the electrical instrument.

The second display unit 312 displays a list of loads of one of the electrical instruments and displays whether a fault is generated in a load selected through the second input unit 311 from the plurality of loads.

Upon input of the name of an electrical instrument through the second input unit 311, the second display unit 312 displays the model number of the corresponding electrical instrument such that the model number of the electrical instrument can be easily input.

The second display unit 312 may display current, voltage and power values of loads being driven as graphs.

The second controller 320 calculates power of a load based on received current data, confirms whether the calculated power is within a predetermined normal power range of the load and determines whether a fault is generated in the load.

Here, the second controller 320 may receive voltage data from the electrical instrument 100 and calculate, power using the received voltage data and current data.

In addition, the second controller 320 may calculate the power using the voltage, 220V, and current of the predetermined commercial power.

The storage unit 330 stores names and model numbers of a plurality of electrical instruments, a list of loads of each electrical instrument model and a normal power range of each load of each electrical instrument.

Here, the normal power range of each load is determined on the basis of a rated power of each load.

The second communication unit 340 transmits information on a selected load to the electrical instrument 100 in response to an instruction from the second controller 320, receives current and voltage data corresponding to each load from the electrical instrument 100 and transmits the current and voltage data to the second controller 320.

The terminal 300 has an application that detects a fault from the electrical instrument 100. This application may be downloaded from an application store or server, upgraded and updated.

As described above, the fault detection system can determine a faulty load by detecting current of only a load suspected to have a fault when a fault is generated in the electrical instrument to thereby improve fault detection accuracy.

Accordingly, the service engineer can easily acquire information on a faulty load and reduce time and cost required for repair service and the electrical instrument manufacturer can enhance its corporate image.

Figure 7:
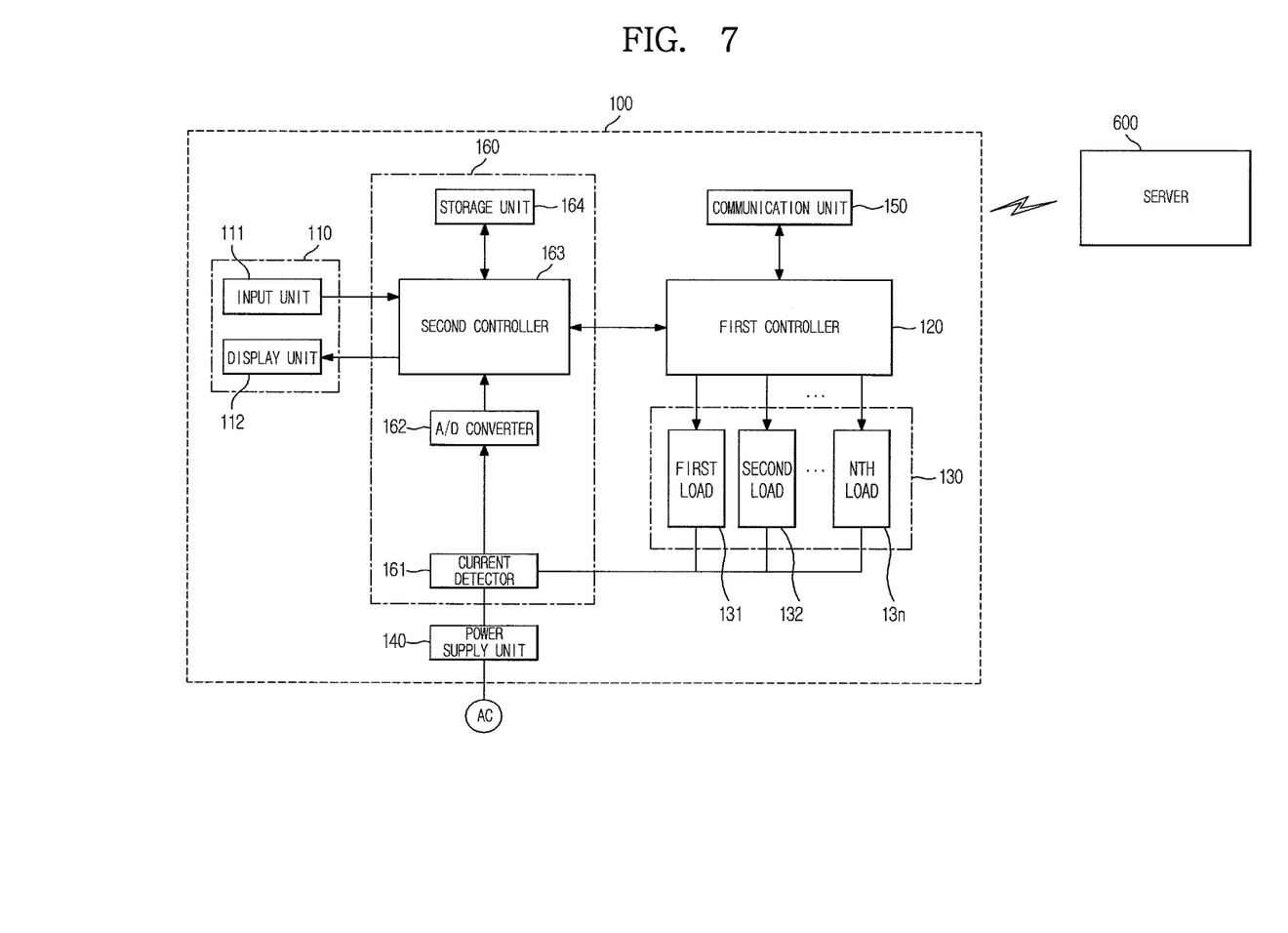
FIG. 7 is a block diagram of a fault device system according to another embodiment of the present disclosure.

FIG. 7 is a block diagram of an electrical instrument according to another embodiment of the present disclosure. The electrical instrument 100 includes the input/output unit 110, the first controller 120, the load part 130, the power supply unit 140, the first communication unit 150, and the fault detector 160.

The input/output unit 110 includes the input unit 111 and the display unit 112.

The user inputs at least one of a target value for power on/off, temporary interruption and driving of the electrical instrument, and an operation mode to the input unit 111. The input information is transmitted to the first controller 120.

The user inputs information on one of a plurality of electrical instruments to the input unit 111 and selects at least one of a plurality of loads of the electrical instrument through the input unit 111. The input unit 111 transmits the information on the electrical instrument and information on the at least one load to the second controller 163. Here, the information on the electrical instrument includes at least one of the name and model number of the electrical instrument.

The display unit 112 displays a driving state of the electrical instrument, a target value set by the user, and a fault state when a fault is generated.

The display unit 112 displays a fault detection application. Accordingly, the display unit 112 displays a list of loads of the electrical instrument and displays whether a fault is generated in the load selected from the plurality of loads through the input unit 111.

The display unit 112 may display current, voltage and power values of loads being driven as graphs.

When the name of the electrical instrument is input through the input unit 111, the display unit 112 displays the model number of the corresponding electrical instrument such that the model number of the electrical instrument can be easily input.

Upon transmission of a command for driving one of the loads through the second controller 163, the first controller 120 determines a fault detection mode and controls the corresponding load to be driven for a predetermined time.

Upon simultaneous reception of signals for selecting a plurality of loads, the first controller 120 sequentially controls the plurality of loads to be driven. Here, the first controller 120 may control the plurality of loads for a predetermined time in an order predetermined by the second controller 163.

In addition, upon simultaneous reception of the signals for selecting a plurality of loads, the first controller 120 may drive the loads in an arbitrary order and transmit information on loads currently being driven to the second controller 163.

When fault detection information is transmitted from the second controller 163, the first controller 120 controls the first communication unit 150 to transmit fault information to the server 600.

The plurality of loads 131 to 13n of the load part 130 are connected to the power supply unit 140 to be respectively supplied with driving powers from the power supply unit 140 and driven in response to a command of the first controller 120.

The power supply unit 140 is provided with power from the commercial power supply AC and supplies drive power to the components 110,120 and 150 and each of the loads 131 to 13n of the load part 130.

The first communication unit 150 performs communication with the server 600 and transmits fault information about the electrical instrument to the service center when a fault is generated in the electrical instrument.

The fault detector 160 detects a fault of the load part 130 and transmits the fault detection result to the first controller 120. The fault detector 160 includes the current detector 161, ND converter 162, second controller 163, and storage unit 164.

The current detector 161 connects each load to the commercial power supply AC.

The current detector 161 detects current flowing in each load while transmitting drive power to each load and transmits the detected current to the ND converter 162.

The electrical instrument may further include a voltage detector (not shown) that detects the voltage of commercial power.

The A/D converter 162 converts the detected current into a digital signal and transmits the digital signal to the second controller 163. The second controller 163 may convert the detected current into a digital signal.

The second controller 163 transmits a command for driving one load to the first controller 120 if a signal for selecting one load is transmitted from the input unit 111 and sequentially transmits commands for driving a plurality of loads to the first controller 120 when signals for selecting the plurality of loads are transmitted from the input unit 111.

That is, the second controller 163 sequentially transmits commands for driving loads such that the loads are not simultaneously driven.

When the user executes an application and at least one load is selected, the second controller 163 controls fault detection for the selected load and controls display of fault state.

Furthermore, the second controller 163 may periodically perform fault detection on each load.

The second controller 163 transmits a load driving command to the first controller 120 when a fault is detected.

In addition, the second controller 163 determines whether a fault is generated in a load by calculating power of the load on the basis of current data and determining whether the power is within a normal power range.

Here, the second controller 163 may calculate the power using detected voltage and current. Furthermore, the second controller 163 may calculate the power using the voltage, 220V, and current of predetermined commercial power.

The second controller 163 may match information on a load currently being driven, transmitted from the first controller 120, and currently detected current and determine whether a fault is generated in the load.

The second controller 163 may be integrated into the first controller 120 such that the first controller 120 performs the function of the second controller 163.

In addition, the second controller 163 may control only current detection of the current detector 161 and application execution of the storage unit 164 and the first controller 120 may determine whether a fault is generated in a load.

The storage unit 164 stores the names and model numbers of a plurality of electrical instruments, a list of loads corresponding to each electrical instrument model and a normal power range of each load of each electrical instrument.

Here, the normal power range of each load is determined on the basis of a rated power of each load.

The storage unit 164 further stores an application for performing fault detection on the electrical instrument 100. This application may be downloaded from an application store or the server 600, upgraded or updated.

As described above, the electrical instrument can directly transmit fault information to the server 600 when a fault is detected to maximize user convenience and determine a fault by detecting power load by load to thereby improve fault detection accuracy.

Moreover, the service engineer can easily acquire fault information on an electrical instrument before visiting the home in which the electrical instrument is installed, prepare a part to replace a faulty part and visit the home, and thus time and cost required for repair service can be reduced and the electrical instrument manufacturer can improve its corporate image.

Although a few embodiments of the present disclosure have been shown and described, it would be appreciated by those skilled in the art that changes may be made in these embodiments without departing from the principles and spirit of the invention, the scope of which is defined in the claims and their equivalents.

What is claimed is:
1. An electrical instrument comprising:
   a load part having a plurality of loads;
   an input unit;
   a power supply unit to provide drive power to the plurality of loads of the load part;

a fault detector comprising a current detector to respectively detect currents flowing in the plurality of loads;

a controller to determine whether each of the loads has a fault on the basis of detected current of each load; and a display to display whether each load has a fault, wherein the controller controls the selected load to be driven and sequentially controls a plurality of loads to be driven when the plurality of loads are selected, and receives a current signal from the current detector when each of the loads is driven, wherein the power supply unit includes a first power terminal, and wherein the fault detector includes a connecting terminal connected to the first power terminal and a second power terminal that is connected to a commercial power supply and transfers commercial power to the connecting terminal through the current detector.

2. The electrical instrument according to claim 1, further comprising a communication unit to transmit information about a fault of the load to a server in response to an instruction from the controller.

3. The electrical instrument according to claim 1, wherein the fault detector further comprises an A/D converter to convert a signal corresponding to current detected by the current detector into a digital signal and to transmit the digital signal to the controller.

4. The electrical instrument according to claim 1, wherein the display unit displays a message representing a fault of the load.

5. The electrical instrument according to claim 1, further comprising a communication unit to transmit a signal corresponding to current of each load to a terminal capable of determining a fault in response to an instruction of the controller.

6. The electrical instrument according to claim 1, further comprising a storage unit to store a normal power range for each load, wherein the controller calculates power of each load on the basis of current detected when each load is driven, determines whether the calculated power is within a normal power range of each load, and determines that the load has a fault when the calculated power is out of the normal power range.

* * * * *